US011239152B2

(12) United States Patent
Torreiter et al.

(10) Patent No.: US 11,239,152 B2
(45) Date of Patent: Feb. 1, 2022

(54) INTEGRATED CIRCUIT WITH OPTICAL TUNNEL

(71) Applicant: International Business Machines Corporation, Armonk, NY (US)

(72) Inventors: Otto Andreas Torreiter, Leinfelden-Echterdingen (DE); Thomas Gentner, Boeblingen (DE); Martin Eckert, Moetzingen (DE)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 16/559,807

(22) Filed: Sep. 4, 2019

(65) Prior Publication Data

US 2021/0066183 A1    Mar. 4, 2021

(51) Int. Cl.
*H01L 25/16* (2006.01)
*H01L 23/522* (2006.01)
*G01Q 60/14* (2010.01)
*G01R 31/265* (2006.01)
*G01R 31/28* (2006.01)

(52) U.S. Cl.
CPC ......... *H01L 23/5222* (2013.01); *G01Q 60/14* (2013.01); *G01R 31/2656* (2013.01); *G01R 31/2851* (2013.01)

(58) Field of Classification Search
CPC ............. H01L 23/5222; G01Q 60/14; G01R 31/2656; G01R 31/2851
See application file for complete search history.

(56) References Cited

U.S. PATENT DOCUMENTS

| 2009/0121322 | A1* | 5/2009 | Ozawa | H01L 23/585 |
| | | | | 257/620 |
| 2010/0200921 | A1* | 8/2010 | Fuchigami | H01L 29/78 |
| | | | | 257/358 |
| 2014/0363905 | A1 | 12/2014 | McShane | |
| 2015/0108506 | A1* | 4/2015 | Zhang | H01L 21/78 |
| | | | | 257/81 |
| 2015/0331508 | A1* | 11/2015 | Nho | G06F 3/0445 |
| | | | | 345/173 |
| 2016/0241776 | A1* | 8/2016 | Kim | H04N 5/23219 |

(Continued)

FOREIGN PATENT DOCUMENTS

WO    2018011373 A1    1/2018

OTHER PUBLICATIONS

"File:Epromf.jpg", Commons, From Wikimedia Commons, the free media repository, this page was last edited on Jan. 5, 2011, at 14:31, 4 pages, Retrieved from <https://commons.wikimedia.org/w/index.php?title=File:Epromf.jpg&oldid=47873580>.

(Continued)

*Primary Examiner* — Samuel Park
(74) *Attorney, Agent, or Firm* — Monchai Chuaychoo

(57) ABSTRACT

The invention relates to an integrated circuit with an active transistor area and a plurality of wiring layers arranged above the active transistor area. At least one optical device is integrated in the active transistor area. The optical device is electrically connected with at least one of the wiring layers. At least one optical tunnel extends from the at least one optical device through the plurality of wiring layers to a surface of an uppermost wiring layer of the plurality of wiring layers facing away from the active transistor area.

11 Claims, 8 Drawing Sheets

(56) References Cited

U.S. PATENT DOCUMENTS

| | | | |
|---|---|---|---|
| 2018/0062112 A1* | 3/2018 | Heo | H01L 51/4246 |
| 2018/0143245 A1 | 5/2018 | Saadany | |
| 2018/0313718 A1 | 11/2018 | Traverso | |
| 2019/0123035 A1* | 4/2019 | Carothers | H01L 21/30621 |
| 2019/0303639 A1* | 10/2019 | He | G06K 9/0012 |
| 2019/0326267 A1* | 10/2019 | Han | H01L 21/76877 |

OTHER PUBLICATIONS

"Floating-gate MOSFET", Wikipedia, This page was last edited on Aug. 8, 2019, at 17:48 (UTC), 5 pages, Retrieved from <https://en.wikipedia.org/w/index.php?title=Floating-gate_MOSFET&oldid-909950394>.

Barkai et al., "Double-Stage Taper for Coupling Between SOI Waveguides and Single-Mode Fiber", Journal of Lightwave Technology, vol. 26, No. 24, Dec. 15, 2008, pp. 3860-3865.

Dai et al., "Bilevel Mode Converter Between a Silicon Nanowire Waveguide and a Larger Waveguide", Journal of Lightwave Technology, vol. 24, No. 6, Jun. 2006, pp. 2428-2433.

Kopp et al., "Silicon Photonic Circuits: On-CMOS Integration, Fiber Optical Coupling, and Packaging", IEEE Journal of Selected Topics in Quantum Electronics, vol. 17, No. 3, May/Jun. 2011, pp. 498-509.

Kufer et al., "Photo-FETs: Phototransistors Enabled by 2D and 0D Nanomaterials", ACS Phototonics 2016, 3, 12, 2197-2210, Publication Date: Oct. 27, 2016, <https://doi.org/10.1021/acsphototonics.6b00391>, 9 pages.

Masanovic et al., "A high efficiency input/output coupler for small silicon photonic devices", Received Jun. 15, 2005; revised Aug. 31, 2005; accepted Sep. 1, 2005, Sep. 19, 2005 / vol. 13, No. 19 / Optics Express 7374, 6 pages.

Snyman et al., "An Efficient Low Voltage, High Frequency Silicon CMOS Light Emitting Device and Electro-Optical Interface", IEEE Electron Device Letters, vol. 20, No. 12, Dec. 1999, pp. 614-617.

Xu et al., "Silicon Light-emitting Device in Standard CMOS technology", POEM 2015 © OSA 2015, 3 pages.

\* cited by examiner

INTEGRATED CIRCUIT WITH OPTICAL TUNNEL

BACKGROUND

The present disclosure relates to the field of integrated circuits and, more specifically, to an integrated circuit with an optical tunnel.

In modern mass production of integrated circuits, efficient and effective approaches are required for testing integrated circuits in order to be able to ensure high quality standards. Integrated circuits are for example tested using electrical contacts with which the integrated circuits are provided for test purposes.

SUMMARY

Various embodiments provide an integrated circuit, a manufacturing method for manufacturing an integrated circuit, and a testing method for testing an integrated circuit as described by the subject matter of the independent claims. Advantageous embodiments are described in the dependent claims. Embodiments of the present invention can be freely combined with each other if they are not mutually exclusive.

In one aspect, the invention relates to an integrated circuit. The integrated circuit comprises an active transistor area with a plurality of wiring layers arranged above the active transistor area. The integrated circuit further comprises at least one optical device integrated in the active transistor area. The optical device is electrically connected with at least one of the wiring layers. At least one optical tunnel extends from the at least one optical device through the plurality of wiring layers to a surface of an uppermost wiring layer of the plurality of wiring layers facing away from the active transistor area.

In a further aspect, the invention relates to a manufacturing method for manufacturing an integrated circuit. The manufacturing method comprises manufacturing the integrated circuit comprising an active transistor area with a plurality of wiring layers arranged above the active transistor area. At least one optical device is integrated in the active transistor area. The optical device is electrically connected with at least one of the wiring layers. The manufacturing method further comprises implementing at least one optical tunnel in the integrated circuit. The at least one optical tunnel extends from the at least one optical device through the plurality of wiring layers to a surface of an uppermost wiring layer of the plurality of wiring layers facing away from the active transistor area.

In a further aspect, the invention relates to a testing method for testing an integrated circuit comprising an active transistor area with a plurality of wiring layers arranged above the active transistor area. The integrated circuit further comprises at least one first optical device integrated in the active transistor area. The first optical device is electrically connected with at least one of the wiring layers and at least one optical tunnel extending from the at least one first optical device through the plurality of wiring layers to a surface of an uppermost wiring layer of the plurality of wiring layers facing away from the active transistor area. The testing method comprises providing a test head with at least one second optical device. The at least one second optical device of the test head is positioned above an opening of one of the at least one optical tunnel in the surface of the uppermost wiring layer of the integrated circuit. The at least one second optical device of the test head is used to communicate via optical communication test signals with the first optical device using the at least one second optical device of the test head.

BRIEF DESCRIPTION THE DRAWINGS

DETAILED DESCRIPTION

Figure 1:
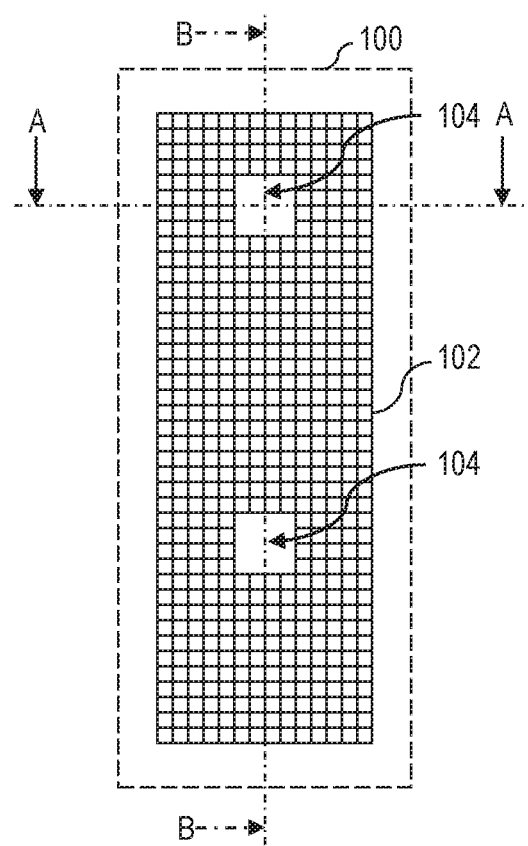
FIG. 1 depicts a schematic diagram of an exemplary integrated circuit with an optical tunnel according to an embodiment.

The descriptions of the various embodiments of the present invention are being presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments may have the beneficial effect of allowing for high speed test and operation of integrated circuits using optical communication via optical tunnels implemented in the integrated circuits for test purposes. The testing may be performed with test probe heads and test systems configured for an optical communication with optical devices, like optical receivers and senders, of the integrated circuits. High speed testing may in particular be enabled for integrated circuits with a silicon very-large-scale integration (VLSI) chip design, e.g. based on a CMOS or BiCMOS process. Besides an integrated circuit with an optical tunnel, an efficient testing method and testing apparatus in form of an electrooptical test head may be provided for testing the integrated circuit with one or more optical tunnels in silicon.

An integrated circuit refers to a set of electronic circuits on a small flat piece, i.e., chip, of semiconductor material, e.g., silicon. By integrating a large number of tiny transistors into a small chip integrated circuits may be provided that are orders of magnitude smaller, faster, and less expensive than those constructed of discrete electronic components.

Optical communication, i.e., communication through optical IO's, may allow for higher bandwidth compared to an electrical communication via electrical IO's. By creating free spaces extending through the plurality of wiring layers, i.e., metal layers, and surrounded, e.g., by metal, optical tunnels may be implemented on the top side of a chip. This allows for integrating electrical power, signal connections and optical coupling are attached from the same packaging side of the chip or module providing the integrated circuit.

Providing an optical tunnel extending from an optical device integrated in a wafer, like a CMOS or BiCMOS wafer, and extending through the plurality of wiring layers to a surface of an uppermost wiring layer of the plurality of wiring layers facing away from the wafer may enable an optical coupling on a front-side of the chip. The respective optical tunnels may be provided above an active transistor area of the integrated circuit. According to embodiments, the optical tunnels for an optical coupling may be provided on the same side as electrical contacts for an electrical coupling.

Embodiments may have the beneficial effect of avoiding any back-side attachment of optical couplings. A back-side coupling would require on or more fibers extending from the back-side through the chip or module. Furthermore, a necessity of managing two packaging surfaces of the chips and modules may thus be avoided. According to embodiments, the optical tunnel may provide a window in the chip front-end wide enough to let light pass through from top to bottom and/or vice versa.

Providing an optical device, like a light-emitting diode (LED) or a photo transistor, in silicon may require an opening for sending and/or receiving optical signals, i.e., light. Such an opening may be provided in form of an optical tunnel extending through the wiring layers. The optical tunnel may be filled with a translucent, e.g., transparent material. For example, the optical tunnel may be filled with $SiO_2$ for enabling a transmission of light via the optical tunnel.

According to embodiments, chip design masks may be used containing shapes which open the wiring layers during optical imaging processing, e.g., of wafers.

According to embodiments, the optical device is configured for a communication using optical signals transmitted through the optical tunnel. Embodiments may have the beneficial effect of allowing for higher bandwidths and faster communication via optical tunnels compared to wires inside silicon.

According to embodiments, the optical device is an optical sender configured for sending optical signals through the optical tunnel. Embodiments may have the beneficial effect of enabling the integrated circuit to send optical communication signals. According to embodiments, the optical sender may, e.g., be a light-emitting diode.

According to embodiments, the optical device is an optical receiver configured for detecting optical signals sent through the optical tunnel. Embodiments may have the beneficial effect of enabling the integrated circuit to receive optical communication signals. According to embodiments, the optical receiver may, e.g., be a photo transistor.

According to embodiments, the integrated circuit is manufactured using a very-large-scale integration (VLSI) process. VLSI refers to a process of creating an integrated circuit by combining millions of transistors or devices into a single chip. Embodiments may have the beneficial effect of enabling an optical communication and testing using optical communication for integrated circuits comprising a large number of active devices, i.e. transistors.

According to embodiments, the integrated circuit is manufactured using a complementary metal-oxide-semiconductor (CMOS) process. The active transistor area may be provided by a CMOS wafer.

Complementary metal-oxide-semiconductor (CMOS) refers to a technology for constructing integrated circuits and is a form of metal-oxide-semiconductor field-effect transistor (MOSFET) semiconductor. CMOS technology may, e.g., used in microprocessors, microcontrollers, static RAM, and other digital logic circuits. Typical design style with CMOS may use complementary and symmetrical pairs of p-type and n-type MOSFETs for logic functions. CMOS also allows a high density of logic functions on a chip. It was primarily for this reason that CMOS became the most used technology to be implemented in very-large-scale integration (VLSI) chips.

According to embodiments, the integrated circuit being manufactured by a bipolar complementary metal-oxide-semiconductor (BiCMOS) process. The active transistor area comprises a BiCMOS wafer.

BiCMOS refers to an evolved semiconductor technology that integrates two formerly separate semiconductor technologies, those of the bipolar junction transistor and the CMOS transistor, in a single integrated circuit device. Bipolar junction transistors may offer high speed, high gain, and low output resistance, which may be excellent properties for high-frequency analog amplifiers, whereas CMOS technology offers high input resistance and may be excellent for constructing simple, low-power logic gates. BiCMOS circuits use the characteristics of each type of transistor most appropriately. Generally, this means that high current circuits may use MOSFETs for efficient control, and portions of specialized very high performance circuits may use bipolar devices. A bipolar junction transistor refers to a transistor using electrons as well as holes as charge carriers.

According to embodiments, the optical tunnel may have a diameter of 10 to 20 times a wavelength of light intended to be used for the optical communication. For infrared light with a wavelength of about 1 μm, the diameter of the optical tunnel may be of the size of 10 to 20 μm. In contrast a typical diameter of an electrical contact may be about 80 μm.

Embodiments may have the beneficial effect that the width of the opening is smaller than the width of the entire chip. Embodiments may have the beneficial effect of implementing a pipe for guiding the light. Embodiments may have the beneficial effect of providing a sender capability for communication. Embodiments may have the beneficial effect of providing a receiver capability for communication. Embodiments may have the beneficial effect that the optical tunnel is incorporated into the chip area extending from an uppermost wiring layer into the chip. According to embodiments, the integrated circuit may comprise no floating gates.

According to embodiments, the optical tunnel is filled with a translucent, dielectric filling material. Embodiments may have the beneficial effect of enabling an efficient and effective transmission of light through the optical tunnel.

According to embodiments, the translucent, dielectric filling material is silicon dioxide. According to embodiments, the optical tunnel is filled with regular $SiO_2$. Embodiments may have the beneficial effect that $SiO_2$ may is required for other steps of the integrated circuit fabrication process. Thus, a filling with $SiO_2$ may efficiently be integrated into the fabrication process. Furthermore, $SiO_2$ may be used as an efficient medium for transmitting light.

According to embodiments, the wafer is a silicon-wafer.

According to embodiments, inner walls of the optical tunnel are coated with a cladding material having a different refractive index compared to a refractive index of the filling material surrounded by the cladding material. According to embodiments, the cladding material may be a metallic coating. Embodiments may have the beneficial effect of providing by the coating a closed boundary with metal shapes surrounding the optical tunnel resulting in a well-defined light conductor. According to embodiments, the refractive index of the cladding material may be smaller than the refractive index of the filling material. Embodiments may have the beneficial effect of implementing an effective optical waveguide. A coating may, e.g., be applied using epitaxial growth, depositing or metal coating.

According to embodiments, the optical tunnel extends perpendicularly to the active transistor area and the surface of the uppermost wiring. Embodiments may have the beneficial effect of providing a short and direct propagation path through the plurality of wiring layers.

Embodiments may provide straight optical tunnel extending from the active transistor area through the plurality of wiring layers. The optical tunnel may extend vertically through the wiring layers. The optical tunnel may extend under an angle with the parallel wiring layers of 90° to 30°, of 90° to 45°, of 90° to 60°, or of 90° to 80°. Embodiments may have no need for extra area laterally outside the active transistor area in order to enable optical communication. Furthermore, embodiments may have no need for optical guiding elements, like mirrors for light deflection. According to embodiments, no change of direction may be required for light propagation. The light may propagate into the same direction from an external sender down to an optical receiver of the integrated circuit or from an optical sender of the integrated circuit up to an external optical receiver.

According to embodiments, parallel wave running paths may be used for sending and receiving light from an optical sender in a test head down to the chip active region and for receiving light emitted from an optical sender in the chip active region using an optical receiver in the test head, respectively. Embodiments may have the beneficial effect of not limiting the scope to perpendicular wave propagation between probe and chip under test.

No space adjacent to the chip's active transistor area, like a dicing area or dicing street between chips, is required for integrating the optical tunnel. Embodiments may have the beneficial effect of avoiding any need for sacrificial regions. Embodiments may have the beneficial effect that the optical tunnel remains on the active die area. The optical tunnel may remain even after testing and may be used functionally, e.g. for short distance usage.

According to embodiments, the integrated circuit further comprises one or more optical elements, e.g., a lens, located in the optical tunnel. For example, an optical element, like a lens, may be located at an opening of the optical tunnel in the surface of the uppermost wiring layer. A plurality or optical elements arranged in the tunnel, e.g., in series along the tunnel, may provide an optical system. The optical system may, e.g., improve the light transmission through the tunnel. Embodiments may have the beneficial effect of enabling a focusing of light received and/or sent via the optical tunnel.

According to embodiments, the manufacturing method may be configured to manufacture any of the embodiments of the integrated circuit described herein.

According to embodiments, the manufacturing of the integrated circuit comprises in each of the wiring layers of the plurality of wiring layers omitting through a cross section of the optical tunnel parallel to the active transistor area any wiring, which is electrically not connected with the with optical device. Embodiments may have the beneficial effect of enabling an efficient implementation of the optical tunnels into the plurality of wiring layers.

According to embodiments, the implementing of the optical tunnel comprises excavating the optical tunnel. Embodiments may have the beneficial effect of providing an empty tunnel, which may be filled with a suitable material for transmitting light, like $SiO_2$. The excavating may, e.g., comprise photolithographic and/or chemical processing steps.

According to embodiments, the implementing of the optical tunnel further comprises filling the optical tunnel with a translucent, dielectric filling material. Embodiments may have the beneficial effect of enabling an efficient and effective transmission of light via the optical tunnel.

According to embodiments, the implementing of the optical tunnel further comprises coating inner walls of the optical tunnel with a cladding material having a different refractive index compared to a refractive index of the filling material surrounded by the cladding material. According to embodiments, the cladding material may be a metallic coating. Embodiments may have the beneficial effect of efficiently shielding the wiring layers from light and effectively guiding optical signals through the optical tunnel. Embodiments may introduce an additional metal-wiring-placement steps into the regular VLSI CMOS process to enable the coating of the optical tunnel to an optical device at lowest CMOS level. Thus, optical tunnels may be opened through all metal layers and filled with regular $SiO_2$. The optical tunnels may provide windows on a front-end of the integrated circuit to guide light as a signal through all wiring layers.

According to embodiments, the refractive index of the cladding material may be smaller than the refractive index of the filling material. Embodiments may have the beneficial effect of implementing an effective optical waveguide.

According to embodiments, the implementing of the optical tunnel further comprises arranging one or more optical elements, e.g. a lens, in the optical tunnel. For example, an optical element, like a lens, may be arranged at the opening of the optical tunnel in the surface of the uppermost wiring layer. A plurality or optical elements arranged in the tunnel, e.g., in series along the tunnel, may provide an optical system. The optical system may, e.g., improve the light transmission through the tunnel. Embodiments may have the beneficial effect of enabling a focusing of optical signals transmitted via the optical tunnel.

According to embodiments, the testing method is configured to test any of the embodiments of the integrated circuit described herein. In particular, the test head may be configured to test any of the embodiments of the integrated circuit described herein. The testing method for testing the integrated circuit may be executed using a computer system comprising a processor and a memory storing computer-executable program instructions. Execution of the program instructions by the processor may cause the processor to control the computer system to execute the testing method. The computer system may, e.g., control the test head. A computer program product for testing the integrated circuit may be provided. The computer program product may comprise a computer readable storage medium having program instructions embodied therewith. The program instructions may be executable by a computer system to cause the computer system to execute the testing method.

Embodiments may have the beneficial effect of enabling a contactless testing via optical test signals, e.g., using one frequency of light only. Embodiments may further allow for a short distance between the source of light of the test header and the silicon active area providing the optical devices of the integrated circuit avoiding signal attenuation.

Test aspects may for example relate to a build-in self-test which may be used for various applications like logic test (LBIST) or array test (ABIST). The testing may also relate to setting up architectural verification patterns used for functional testing. The tests may be used to determine if the integrated circuit functions properly. Wafer testing may be performed using a wafer prober with a test head to identify functional defects by applying special test patterns. Chips may be tested again after packaging.

According to embodiments, the method comprising at least one of the following: The at least one second optical device of the test head is an optical sender, the at least one first optical device of the integrated circuit is an optical receiver, and the optical sender of the test head sends an optical communication test signal to the optical receiver of the integrated circuit. The at least one second optical device of the test head is an optical receiver, the at least one first optical device of the integrated circuit is an optical sender, and the optical receiver of the test head receives an optical communication test signal from the optical sender of the integrated circuit.

Embodiments may have the beneficial effect of enabling an optical communication between the test head and the integrated circuit.

According to embodiments, the test head further comprises first electrical contacts configured for contacting second electrical contacts of the integrated circuit. The testing method further comprises applying by the test head an operation voltage to the integrated circuit via the second electrical contacts of the integrated circuit using the first electrical contacts of the test head simultaneously with the communicating via the optical communication test signals.

According to embodiments, the test head may provide interfacing with a chip under test in form of electrical pins or needles for electrical coupling as well as openings with optical devices therein for optical coupling.

Embodiments may have the beneficial effect of providing power to the integrated circuit under test via regular electrical contacts, like probe pins or needles. At the same time, the test head may interfere with at least one optical sender and one optical receiver of the integrated circuit for optical test signal interaction. According to embodiments, further electrical control signals to activate the logic and/or optical interaction of the integrated circuit may be in place via the electrical contacts in parallel to the optical input/outputs.

FIG. 1 shows an exemplary integrated circuit 100 with a plurality of optical tunnels 104 according to an embodiment. Depicted is a top view of the integrated circuit 100 of a chip. The chip may be manufactured using a VLSI CMOS process of VLSI BiCMOS process. A plurality of metal wiring lines 102 extend through a plurality of wiring layers. The wiring lines 102 in each of the wiring layers omit a cross section of the optical tunnel 104 building dedicated segments opened in all wiring layers. The optical tunnel 104 may be filled with a translucent, dielectric filling material, e.g. $SiO_2$, enabling optical signals to propagate from an uppermost wiring layer through all the wiring layers of the plurality of wiring layers to an optical device located at the bottom of the optical tunnel 104 or vice versa.

Figure 2:
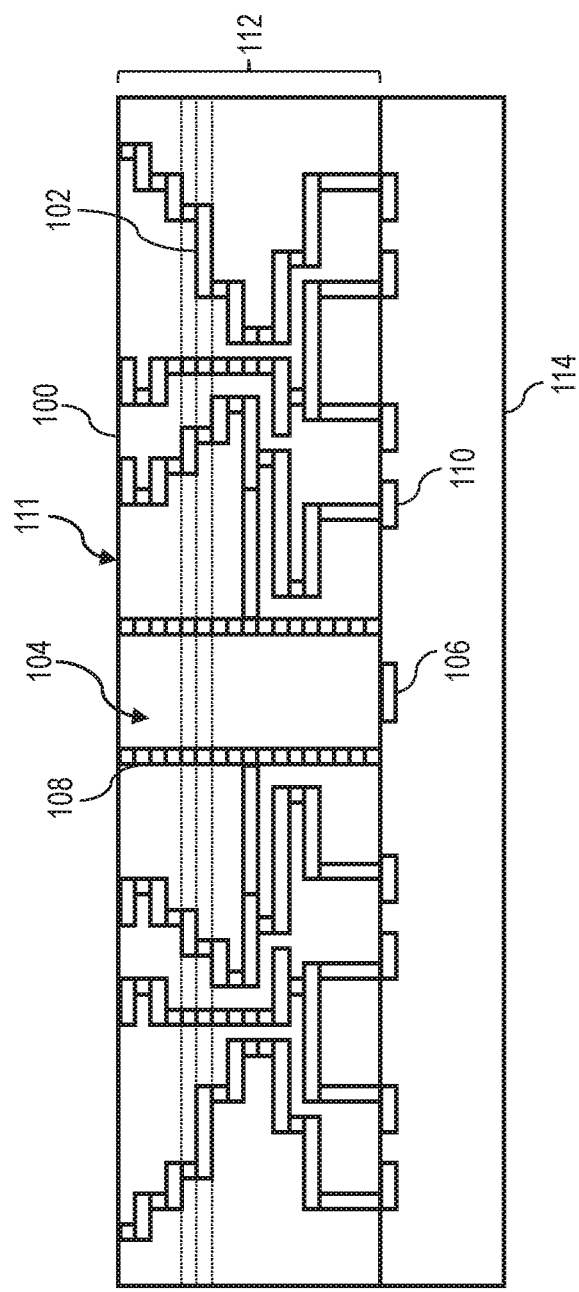
FIG. 2 depicts a schematic diagram of an exemplary integrated circuit with an optical tunnel according to an embodiment.

FIG. 2 shows a cross section of the exemplary integrated circuit 100 of FIG. 1 along the intersection A-B. Depicted is a side view of the structure of the integrated circuit 100. The structure is a multilayer structure. The multilayer structure may comprise a wafer 114, e.g., a CMOS wafer or BiCMOS wafer, building an active transistor area with active devices 110, e.g., transistors, and at least one optical device, e.g., an optical sender or receiver, at the ground of an optical tunnel 104. The active devices 110 implemented in the wafer 114 may be electrically connected via the wire lines 102 extending through the wiring layers of the plurality of wiring layers 112. The optical tunnel 104 may extend vertically through the plurality of wiring layers 112 from a surface 111 of an uppermost wiring layer of the plurality of wiring layers 112 facing away from the active transistor area provided by the wafer 114 to the wafer 114. Inner walls of the optical tunnel 104 may be coated with a cladding material, e.g., a metallic coating 108 shielding $SiO_2$-segments of the wiring layers from optical signals transmitted through the optical tunnel 104. Thus, the optical tunnel 104 may build a wave guide guiding electromagnetic wave along the optical tunnel 104. The metallic coating 108 may enclose a translucent, dielectric filling material within the optical tunnel 104, e.g., $SiO_2$. It is noted that chip optical device 106 contains a receiving and a transmitter unit, i) chip optical receiver 106.1 and ii) chip optical sender 106.2, respectively.

Figure 3:
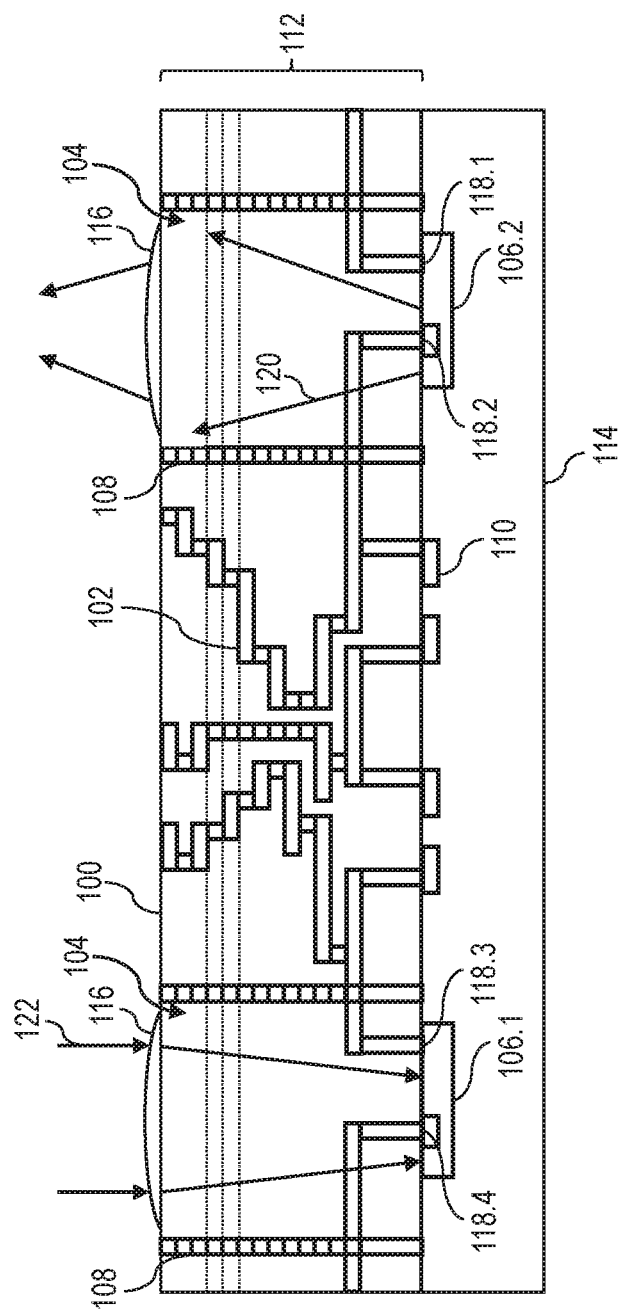
FIG. 3 depicts a schematic diagram of an exemplary integrated circuit with an optical tunnel according to an embodiment.

FIG. 3 shows a cross section of an alternative embodiment of the exemplary integrated circuit 100 of FIG. 1 along the intersection B-B. The integrated circuit 100 may be manufactured using a VLSI processes and comprise an active transistor area provided by a wafer, e.g., a CMOS or BiCMOS wafer. The active transistor area may comprise a plurality of active devices 110 electrically connected via wire lines 102 provided by a plurality of wiring layers 112 arranged above the active transistor area. The cross section shown in FIG. 3 comprises two optical tunnels 104 filled with a translucent, dielectric filling material, e.g., $SiO_2$. The inner walls of the optical tunnels 104 may be coated with a cladding material to guide electromagnetic waves of optical communication signals along the optical tunnels 104 through the plurality of wiring layers 112. At the ground of a first one of the two optical tunnels 104, is an optical device in the form of an optical receiver (i.e., chip optical receiver 106.1) e.g., a photo transistor. Furthermore, an optical element in form of a lens 116 may be located at an opening of the first optical tunnel 104 in the surface 111 of the uppermost wiring layer. External electromagnetic waves of a first optical communication signal 122 may be focused by the lens 116 and guided along the optical tunnel 104 to the photo transistor. The photo transistor may be electrically connected with wire lines of a wiring layer via electrical contacts 118.3 and 118.4. The first optical communication signal may, e.g., be a clock signal or another scan-input. At the ground of a second one of the two optical tunnels 104, is an optical device in the form of an optical sender (i.e., chip optical sender 106.2), e.g., an LED. Furthermore, a lens 116 may be located at an opening of the second optical tunnel 104 in the surface 111 of the uppermost wiring layer. Electromagnetic waves of a second optical communication signal 120 emitted by the LED may be guided along the optical tunnel 104 to the lens 116 and focused. The LED may be electrically connected with wire lines 102 of a wiring layer via electrical contacts 118.1 and 118.2. The second optical communication signal 120 emitted by the LED may, e.g., be a scan-output. The second optical communication signal 120 may be sent in response to receiving the first optical communication signal 122 or vice versa. A combination of a chip optical receiver 106.1 and a chip optical sender 106.2 enables a communication via optical communication signals 120, 122.

Figure 4:
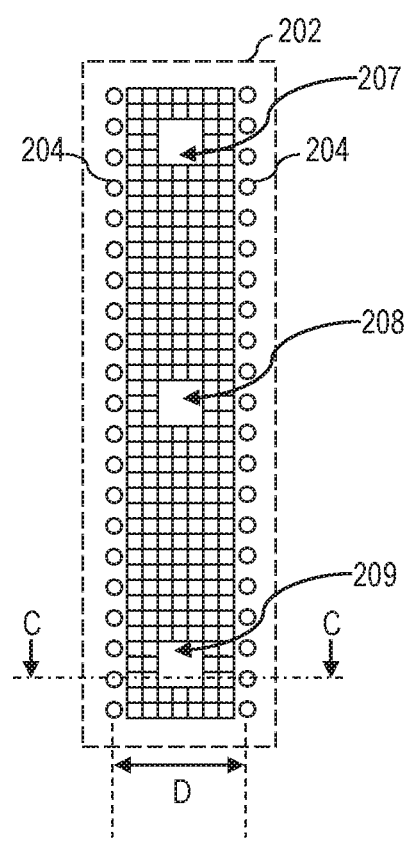
FIG. 4 depicts a schematic diagram of an exemplary test head for testing an integrated circuit with an optical tunnel and electrical contacts according to an embodiment.

FIG. 4 shows an exemplary test head 202 for testing an integrated circuit with an optical tunnel and electrical contacts according to an embodiment. Depicted is a bottom view of the test head 202. The test head comprises openings 207, 208, 209 in a housing of the test head. Within the openings 207, 208, 209 optical devices may be arranged, like an optical sender configured for sending optical communication test signals or an optical receiver configured for receiving optical communication test signals. An optical communication test signal sent by an optical sender of the teats head 202 may comprise a scan-input of a test scan or a clock signal. An optical communication test signal received by an optical receiver of the test head 202 may comprise a scan-output of a test scan. In addition, the test head may comprise a plurality of needle contacts 204 configured for contacting electric contacts of an integrated circuit under test, e.g., for supplying power and/or providing an operational voltage. The needle contacts 204 may, e.g., be arranged in rows spaced apart from each other by a distance D.

Figure 5A:
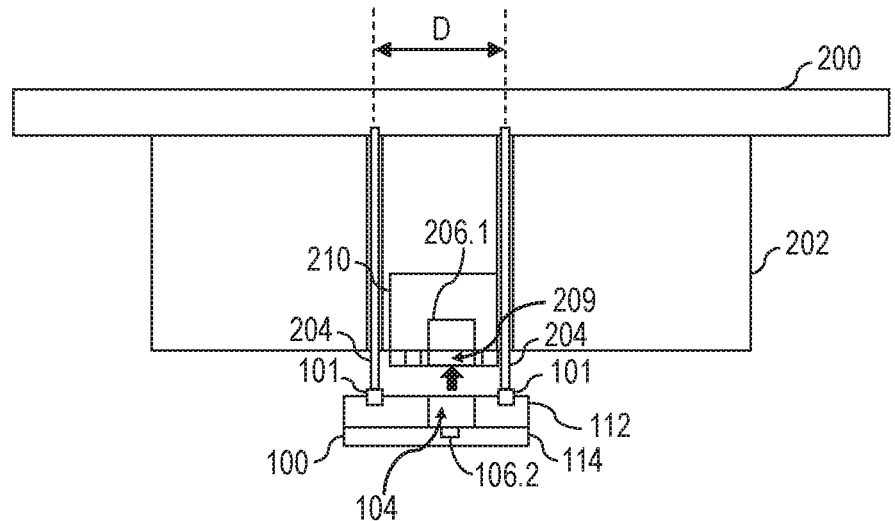
FIG. 5a and FIG. 5b depicts a schematic diagram of an exemplary test head for testing an integrated circuit with an optical tunnel and electrical contacts according to an embodiment.
Figure 5B:
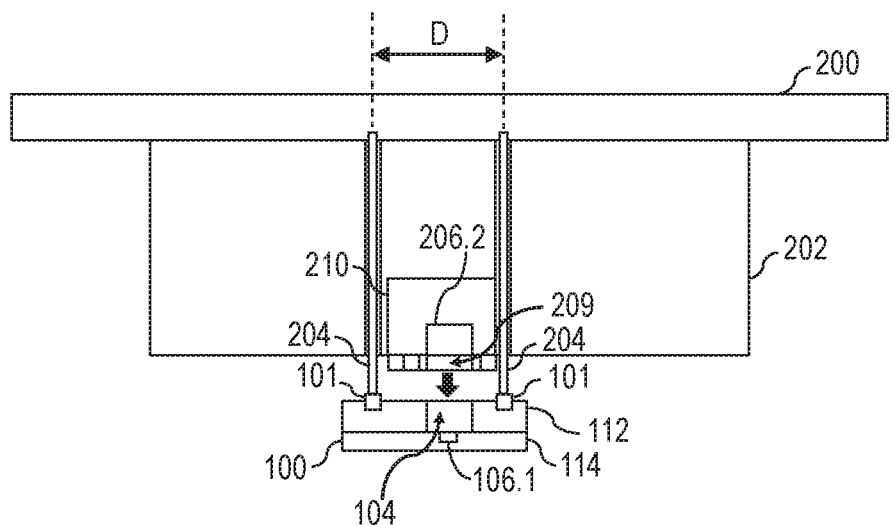

FIG. 5a and FIG. 5b shows a cross section of the test head 202 an integrated circuit 100 with an optical tunnel 104 and electrical contacts 101 along the intersection C-C of FIG. 4. Depicted is a side view of the test head 202 as well as an integrated circuit 100 under test. The test head 202 is located at a test board 200. The test board 200 may comprise a plurality of test head 202 for testing a plurality of integrated circuits 100 in parallel. The needle contacts 204 of the test head 202 may be spaced apart from each other by a distance D and configured for establishing an electrical connection with electric contacts 101 of the integrated circuit 100. The needle contacts 204 may be configured for contacting the electric contacts 101 of an integrated circuit 100 under test, e.g., for supplying power and/or providing an operational voltage. A housing 210 of the test head 202 may comprise a test head optical device, e.g., an optical sender, like a light emitting diode, or an optical receiver, like a photo transistor. The housing 210 further comprises an opening 209 for receiving and/or sending an optical communication test signal. It is noted that test head optical device comprises of i) test head optical receiver 206.1 and ii) test head optical sender 206.2. It is further noted that chip optical sender 106.2 can be combined with test head optical receiver 206.1. The directional arrow from 106.2 to 206.1 indicates the direction of the optical beam (FIG. 5a). Conversely, chip optical receiver 106.1 can be combined with test head optical sender 206.2. The directional arrow from 206.2 to 106.1 indicates the direction of the optical beam (FIG. 5b).

For example, an optical communication test signal emitted by a test head optical sender 206.2 (i.e., sender) of the test head 202 is guided through the optical tunnel 104 of the integrated circuit 100 to chip optical device 106 at the bottom of optical tunnel 104, e.g. an optical receiver. The chip optical device 106 may be part of an active transistor area of the integrated circuit 100 provided by a CMOS or BiCMOS wafer. Alternatively, an optical communication test signal emitted by a chip optical sender 106.2 of the integrated circuit 100 may be received by a test head optical device 206.1. The distance between the optical device of the test head and optical device of the integrated circuit may be small and well-defined distance.

Figure 6:
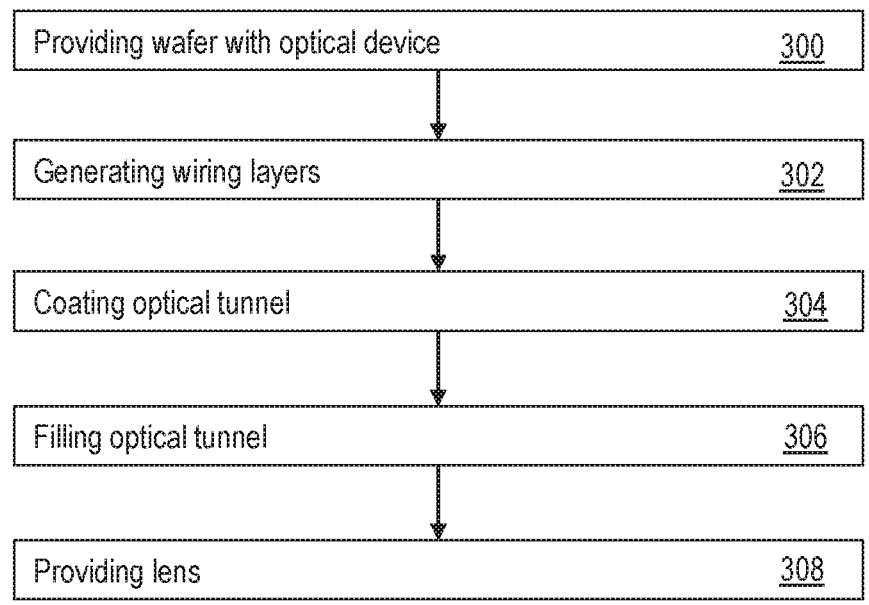
FIG. 6 depicts a schematic flow diagram of an exemplary manufacturing method for manufacturing an integrated circuit with an optical tunnel according to an embodiment.

FIG. 6 shows a schematic flow diagram of an exemplary manufacturing method for manufacturing an integrated circuit with an optical tunnel according to an embodiment. In step 300 a silicon wafer with an active transistor area implemented therein is provided. The active transistor area may comprise a plurality of transistors. The wafer may for example be a CMOS or BiCMOS wafer. In step 302, a plurality of wiring layers is generated on top of the active transistor area. The generating of the wiring layers may be performed using a VLSI CMOS process or VLSI BiCMOS process. The wire lines comprised by the wiring layers may be designed to keep a cross section of at least one optical tunnel parallel to the wafer free from any wiring not electrically connected with an optical device integrated in the wafer, i.e., active transistor area, at a ground of the optical tunnel. In step 304, inner walls of the optical tunnel are coated with a cladding material, e.g. a metallic coating. For example, a closed wire line in each wiring layer may be built enclosing the cross section of the optical tunnel parallel to the wafer successively forming the metallic coating around the optical tunnel shielding the remaining portions of the wiring layers from optical signal propagating through the optical tunnel. In step 306, the optical tunnel is filled with a translucent, dielectric filling material, like $SiO_2$. For example, when generating the wiring layers, the optical tunnel may successively be filled with $SiO_2$. According to the aforementioned examples, the coating and the filling of the optical tunnel is executed simultaneously with the generating of the wiring layers. In other words, the steps 302, 304 and 306 may be executed simultaneously. According to an alternative embodiment, the optical tunnel is kept empty. After generating of the wiring layer in step 302 with at least one empty optical tunnel therein, the inner walls of the optical tunnel are coated with a cladding material in step 304 and filled in step 306. In other words, the steps 302, 304 and 306 may be executed successively. In step 308, a lens may be provided at an opening of the optical in a surface of the uppermost wiring layer facing away from the wafer.

Figure 7:
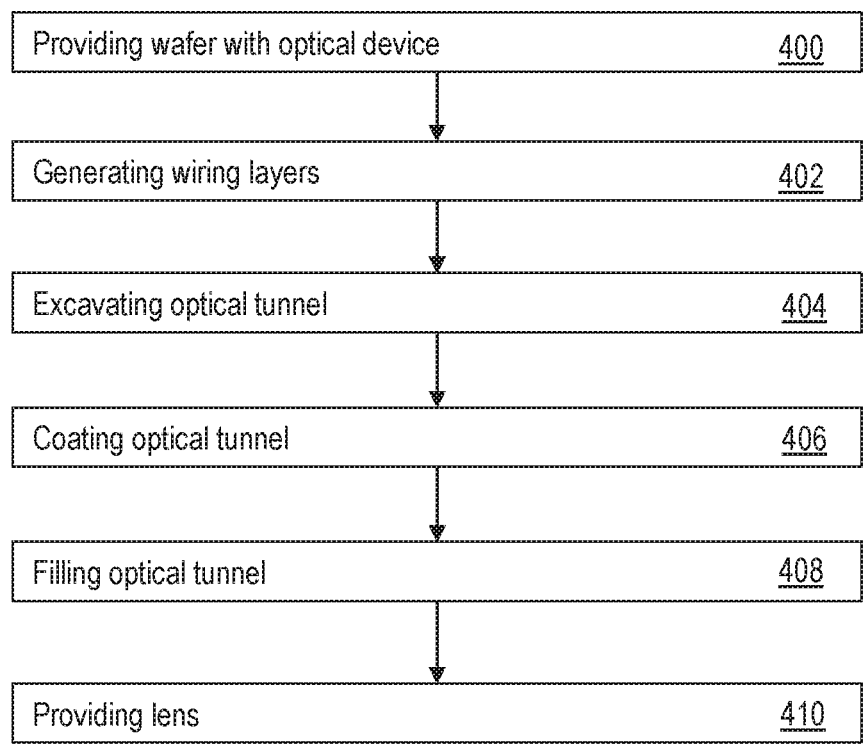
FIG. 7 depicts a schematic flow diagram of an exemplary manufacturing method for manufacturing an integrated circuit with an optical tunnel according to an embodiment.

FIG. 7 shows a schematic flow diagram of an exemplary manufacturing method for manufacturing an integrated circuit with an optical tunnel according to an embodiment. Steps 400 and 402 may correspond to steps 300 and 304 of FIG. 6. In step 404, the optical tunnel may be excavated in the wiring layers generated in step 402. In step 406, a cladding material may be provided on the inner walls of the optical tunnel. In step 408, the optical tunnel is filled with a translucent, dielectric filling material, like $SiO_2$. In step 410, a lens may be provided at an opening of the optical in a surface of the uppermost wiring layer facing away from the wafer.

Figure 8:
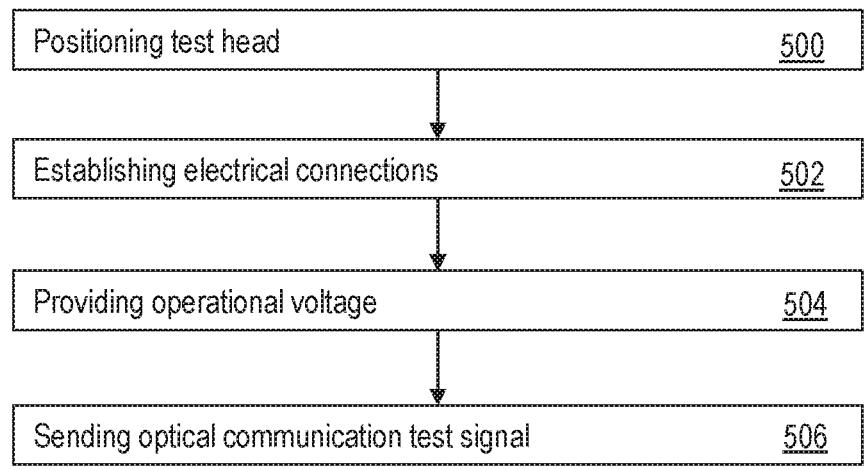
FIG. 8 depicts a schematic flow diagram of a testing method for testing an integrated circuit with an optical tunnel according to an embodiment.

FIG. 8 shows a schematic flow diagram of a testing method for testing an integrated circuit with an optical tunnel according to an embodiment. In step 500, the test head is positioned above an integrated circuit to be tested. At least one optical device of the test head may be adjusted above an optical tunnel of the integrated circuit. Electrical contacts of the test head, e.g., needle contacts, may be adjusted over electrical contacts of the integrated circuit. In step 502, electrical connections may be established between the electrical contacts of the test header and the electrical contacts of the integrated circuit. In step 504, an operational voltage may be provided by the test header to the integrated circuit via the electrical connections. In step 506, an optical communication test signal may be sent by the optical device, i.e., an optical sender, of the test head via the optical tunnel to an optical receiver at the ground of the respective optical tunnel.

Figure 9:
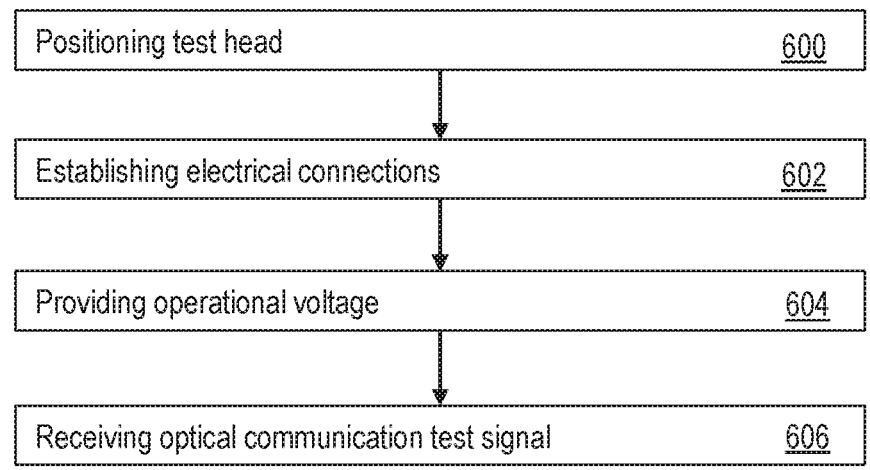
FIG. 9 depicts a schematic flow diagram of a testing method for testing an integrated circuit with an optical tunnel according to an embodiment.

FIG. 9 shows a schematic flow diagram of a testing method for testing an integrated circuit with an optical tunnel according to an embodiment. Steps 600 to 604 correspond to steps 500 to 504 of FIG. 8. In step 606, an optical communication test signal may be received by the optical device, i.e., an optical receiver, of the test head via the optical tunnel from an optical sender at the ground of the respective optical tunnel. According to embodiments, the methods of FIGS. 8 and 9 may be combined. After steps 500 to 506, an optical communication test signal may be received by an additional optical device of the test head, i.e., an optical receiver, as a response to the sending of the optical communication test signal in step 506.

It is understood that one or more of the aforementioned embodiments of the invention may be combined as long as the combined embodiments are not mutually exclusive.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An integrated circuit comprising:
one or more active transistor areas with a plurality of wiring layers and electric contacts arranged above the one or more active transistor area further comprises:
a first optical device integrated in the one or more active transistor areas, the first optical device being electrically connected with at least one of the plurality of wiring layers;
a first lens located at an opening of a first optical tunnel away from the first optical device;
the first optical tunnel extending from the first optical device through the plurality of wiring layers to a surface of an uppermost wiring layer of the plurality of wiring layers facing away from the one or more active transistor areas;
a second optical device integrated in the one or more active transistor areas, the second optical device being electrically connected with at least one of the plurality of wiring layers;
a second lens located at an opening of the first optical tunnel away from the first optical device; and
the second optical tunnel extending from the second optical device through the plurality of wiring layers to a surface of an uppermost wiring layer of the plurality of wiring layers facing away from the one or more active transistor areas.

2. The of claim 1, the first optical device being configured for a communication using optical signals transmitted through the first optical tunnel.

3. The of claim 1, the first optical device being an optical sender configured for sending optical signals through the first optical tunnel.

4. The integrated circuit of claim 1, the second optical device being an optical receiver configured for detecting optical signals sent through the second optical tunnel.

5. The integrated circuit of claim 1, the integrated circuit being manufactured by a very-large-scale integration process.

6. The integrated circuit of claim 1, the integrated circuit being manufactured by a complementary metal-oxide-semiconductor (CMOS) process, the active transistor area comprising a CMOS wafer.

7. The integrated circuit of claim 1, the integrated circuit being manufactured by a bipolar complementary metal-oxide-semiconductor (BiCMOS) process, the active transistor area comprising a BiCMOS wafer.

8. The integrated circuit of claim 1, the first and second optical tunnels being filled with silicon dioxide.

9. The integrated circuit of claim 8, inner walls of the first and second optical tunnels being coated with a cladding material having a different refractive index compared to a refractive index of the silicon dioxide surrounded by the cladding material.

10. The integrated circuit of claim 1, the first and second optical tunnels extending perpendicularly to the one or more active transistor areas and the surface of the uppermost wiring.

11. The integrated circuit of claim 1, the integrated circuit further comprising one or more optical elements located in the first and second optical tunnels.

* * * * *